United States Patent [19]

Aaland

[11] 4,189,650
[45] Feb. 19, 1980

[54] ISOLATED TRIGGER PULSE GENERATOR

[75] Inventor: Kristian Aaland, Livermore, Calif.

[73] Assignee: The United States of America as represented by the United States Department of Energy, Washington, D.C.

[21] Appl. No.: 954,252

[22] Filed: Oct. 24, 1978

[51] Int. Cl.$^2$ ............................................. H03K 3/53
[52] U.S. Cl. ................................... 307/108; 307/109
[58] Field of Search .............. 307/106, 108, 107, 112, 307/17, 109; 328/65, 67; 361/327

[56] References Cited

U.S. PATENT DOCUMENTS

| | | | |
|---|---|---|---|
| 3,558,908 | 1/1971 | Kulikov et al. | 307/107 |
| 3,603,887 | 9/1971 | Doss et al. | 328/59 |
| 3,644,747 | 2/1972 | Gray | 307/106 |
| 3,743,852 | 7/1973 | O'Keefe et al. | 307/109 |

FOREIGN PATENT DOCUMENTS 795307  3/1958  United Kingdom ..................... 307/106

OTHER PUBLICATIONS

Zucker et al., "The Design of a Repetitively Pulsed Megajoule Dense-Plasma Focus," 1975, pp. 40-42, (FIG. 22).

Primary Examiner—L. T. Hix
Assistant Examiner—James L. Dwyer
Attorney, Agent, or Firm—R. V. Lupo; P. Martin Simpson, Jr.; Thomas E. Hill

[57] ABSTRACT

A trigger pulse generation system capable of delivering a multiplicity of isolated 100 kV trigger pulses with picosecond simultaneity.

4 Claims, 2 Drawing Figures

ISOLATED TRIGGER PULSE GENERATOR

BACKGROUND OF THE INVENTION

The invention described herein was made at Lawrence Livermore Laboratory in the course of, or under, contract W-7405-ENG-48 between the United States Department of Energy (formerly Energy Research and Development Administration) and the University of California.

The invention pertains to high voltage trigger pulse systems. More particularly, this invention relates to a resonant charging transformer energy compression system capable of delivering a multiplicity of isolated 100 kV trigger pulses with picosecond simultaneity and nano-second rise time.

Numerous pulse generators for producing high voltage pulses are disclosed in the prior art. These systems generally involve several capacitors arranged in parallel which are charged by an applied voltage and which discharge in series thus producing a high voltage impulse, as in the Marx configuration. In a typical Marx surge-generator circuit a rectified a-c voltage source is used with one terminal of the test piece and one terminal of the transformer grounded. The capacitors are first charged in parallel through charging resistors and then connected in series and discharged through the test piece by means of three-electrode spark gaps. By this technique a very high voltage impulse may be obtained with the actual voltage dependent upon the charging voltage and the number of capacitors. Although trigger pulse systems of the Marx design have been operated with voltage outputs measured in mega-volts and energy storage capacities measured in kilo-joules, various inherent performance limitations exist in these systems. While these limitations are described in the following paragraph, a much more extensive treatment can be found in "High Speed Pulse Technology, Volume III, Capacitor Discharge Engineering", by Frank B. Frungel, published by Academic Press in 1976.

Proper operation of prior art devices embodying a multiplicity of spark gaps requires the frequent adjustment of these high speed switches to ensure the generation of the desired output. The adjustments become increasingly complex as the number of individual spark gaps increases because of the interaction between spark gaps in the production of the output pulse. Another limitation in the Marx type generator arises from the current ground loops which they generate. In many of the applications in which these high voltage pulse generators are used, such as in plasma physics, laser research, the production of pulsed magnetic fields and electrohydraulic metal forming, the environment consists of mega-amperes in the powering circuit and milli-amperes in the signal circuits placing extreme demands on diagnostic equipment sensitivity. The Marx-type design fails to provide the necessary level of electrical isolation not only to accommodate the limited sensitivity of available diagnostic equipment but to protect diagnostic circuitry from electrical overloads. Isolation requirements also arise from electrical codes intended to promote and maintain personnel safety. Another limitation of current systems is low reliability because of the numerous and complex switching configurations in the Marx-type design and its use of extensive capacitor banks. Electrode erosion and the deposition of electrode material on the insulating walls of the switch are the cause of the limited life expectancy. An additional limitation is imposed by the high average power requirement (>1 mega-watt) that a switch has to transfer. These switches generally absorb between 0.1 and 1% of the energy they transfer. Therefore, the dissipation of as much as 10 kilo-watts of heat must be taken into account in the design of the capacitor bank. Inadequate heat dissipation and the structural stress produced by it are also primary sources of capacitor bank failure in continuously operated high voltage pulsed systems. Because of the relatively low reliability of prior art devices expensive performance verification equipment is also typically required to ensure proper operation. A detailed treatment of high energy supply and capacitor bank performance and criteria can be found in Report UCRL-51872, "The Design of a Repetitively Pulsed Megajoule Dense Plasma Focus", Aug. 1, 1975, published by the Lawrence Livermore Laboratory, Livermore, California.

U.S. Pat. No. 3,644,747 to Gray teaches and claims the use of a plurality of spark gaps in series with a delay line connected across each spark gap to produce a pulse of nanosecond duration and higher peak voltage from a lower voltage pulse of longer duration. The capability of distributing the high voltage output to several individual, isolated trigger systems is not discussed. Energy compression is achieved by synchronizing spark gap discharges by means of delay lines connected across each spark gap. The delay introduced by each of these delay lines varies inversely with the order in which they appear in the array. Voltage summation and pulse shortening is achieved by setting the delay time of each delay line as determined by the formative time required for each successive spark gap to breakdown. This pulse generator possesses those limitations inherent in a system utilizing a large number of high voltage spark gaps.

U.S. Pat. No. 3,603,887 to Doss et al. teaches and claims a high power pulsed modulator circuit for generating a sustained output pulse in which the secondary coil of a feedback transformer is connected between the control grid and cathode of a thermionic tube. The primary winding of the feedback control transformer is connected in series with the secondary winding of a high voltage input transformer which in turn is also connected to the tube's cathode and a second control grid. With the input transformer's primary winding being driven by a timing signal pulse source and the anode of the thermionic tube connected to the positive pole of a potential source, the negative pole of which is connected to the feedback transformer's secondary winding via a load resistor, high voltage, rectangular wave pulses can be generated. This system possesses the limitations inherent in vacuum tube technology including a pulse rise time ranging from 50 to 80 microseconds.

High voltage pulse systems frequently make use of trigger spark gaps to very precisely control the firing time of a spark gap. Spark gaps in general are used to speed up an electrical discharge and to protect large, expensive, electronic equipment from overvoltage surges. Once fired, a spark gap can carry extremely large currents over very short time intervals. Before breakdown, or during normal circuit operation, spark gaps are open circuits which impose no current load. After breakdown gap impedance drops to a few ohms thus causing a voltage transient. By altering electrode geometry and incorporating a third trigger electrode, the spark gap's firing time can be made very precise.

This characteristic makes the triggered spark gap an important element in systems involving the precise transfer of high energy from energy storage capacitors. U.S. Pat. No. 3,558,908 to Kulikov et al. teaches and claims a high voltage impulse generator having a spark gap immersed in a liquid dielectric and positioned in the space between the ends of an inner electrode and an outer coaxially-positioned electrode. Because of the short duty cycle and the "self-healing" capacity of the liquid dielectric, this spark gap design exhibits a relatively high reliability. However, this high voltage impulse generator provides only a single, non-distributed output pulse while failing to provide electrical isolation between input and output.

In summary, prior art trigger pulse systems have suffered from various performance limitations such as low reliability, inadequate electrical isolation and the inability to distribute a number of pulses with a high degree of simultaneity. The present invention by means of a new high voltage transformer design, the use of a single liquid dielectric spark gap and a distributed output configuration eliminates the above disadvantages. This can be seen from Table 1 which compares the performance of the cited prior art with measured performance data of the present invention. From this it is evident that the present invention represents a significant improvement over available trigger pulse distribution systems. It is also to be noted that the present invention provides a level of electrical isolation between input and output not available in the prior art which could not be readily reduced to tabular form for comparison purposes.

SUMMARY OF THE INVENTION

The present invention utilizes the discharge of a capacitor bank to apply a high voltage pulse through a dielectric spark gap to the circular primary coil of a transformer. With a multiplicity of secondaries spaced around the primary and enclosed core and with the transformer, capacitor bank and spark gap located in a fluid dielectric-filled enclosure, each secondary is capable of delivering a high voltage pulse synchronously with all other secondary pulses.

capable of continuous operation over an extended period of time by reducing the number of required spark-gaps to one thereby minimizing the number and complexity of switch adjustments inherently necessary in such systems while increasing system reliability.

It is yet another object of the invention to provide a high voltage master trigger generator capable of delivering simultaneous trigger voltages to a multiplicity of high power switches in which time delay jitter is essentially reduced to zero.

These and other advantages, objects and features of the invention will become more apparent from the following detailed description when taken in conjunction with the illustrated embodiment in the accompanying drawings.

BRIEF DESCRIPTION OF THE DRAWINGS

The invention will be described in greater detail by reference to the drawings in which.

While the invention will be described in connection with a preferred embodiment, this description is not intended to limit the invention to that embodiment. On the contrary, it is intended to cover all alternatives, modifications and equivalents as may be included within the spirit and scope of the invention as defined by the appended claims.

DESCRIPTION OF PREFERRED EMBODIMENT

Figure 1:
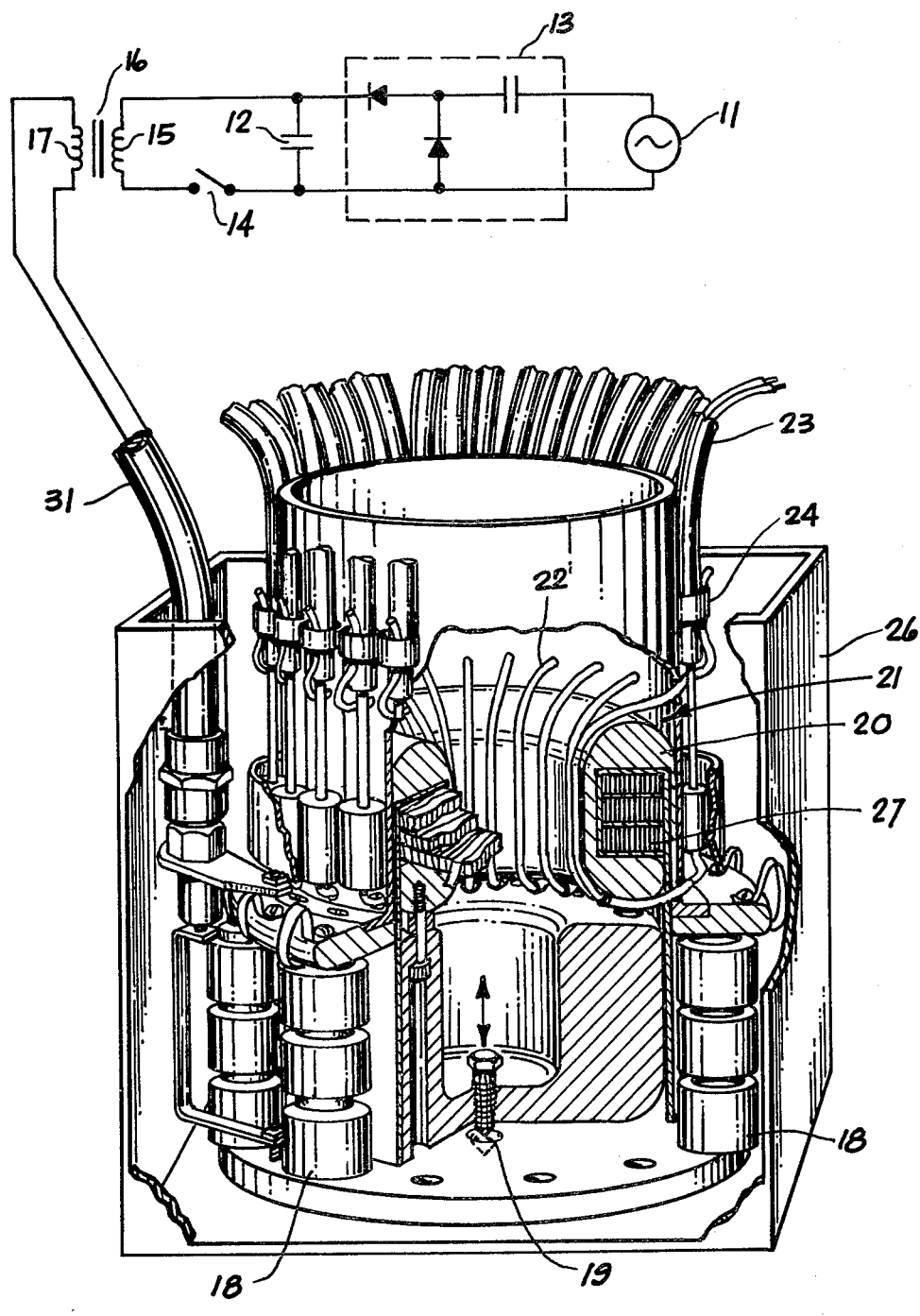
FIG. 1 is an illustration of the isolated trigger pulse generator apparatus in accordance with this invention as well as a schematic of the input source circuitry.
Figure 2:
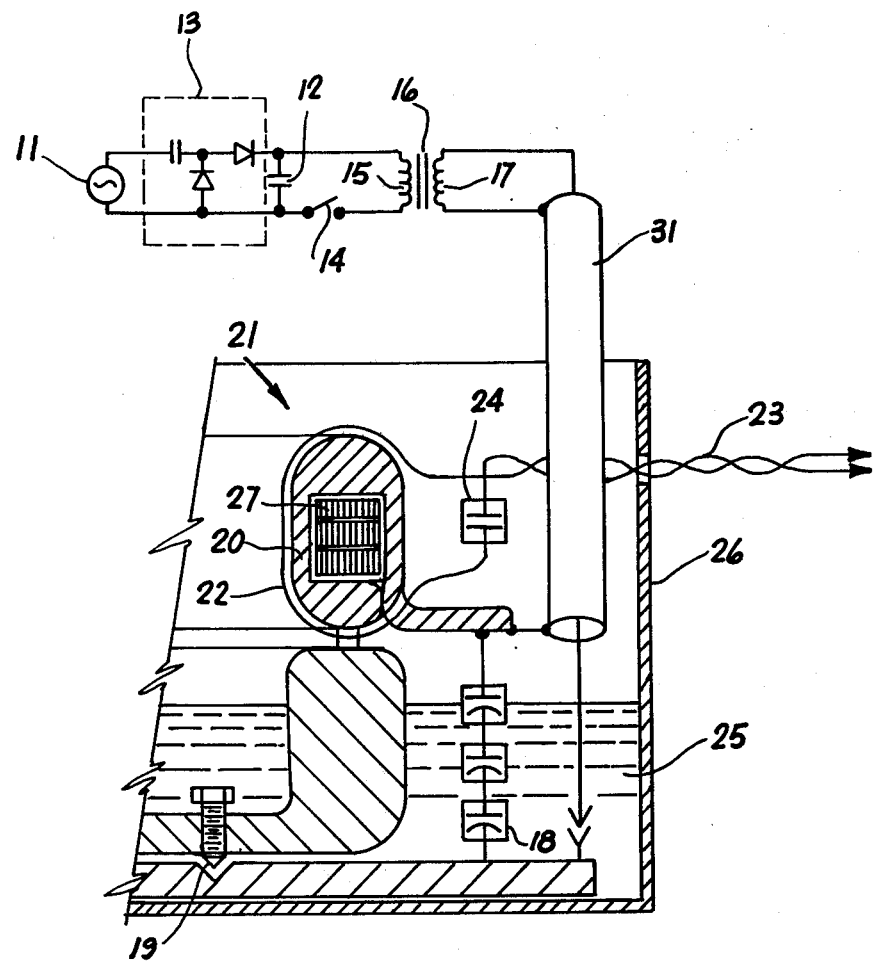
FIG. 2 is a complete schematic illustration of circuitry for applying an input voltage to the isolated trigger pulse generator apparatus and for distributing the stepped-up voltage to 24 separate, isolated output leads.

Referring now to FIGS. 1 and 2, there is shown an isolated trigger pulse generator apparatus having an AC voltage source 11. In the preferred embodiment of the subject invention a 3 kV AC source is used. The AC voltage source 11 charges a capacitor bank 12 via a voltage doubler circuit 13 which permits an efficient charging of the capacitor bank 12 with a given AC source. Upon discharge of the capacitor bank 12 with

TABLE I

| Apparatus | Simultaneity of Delivery of Multiple Pulses (sec.) | Pulse Repetition Rate (sec$^{-1}$) | Peak Pulse Voltage (KV) | Pulse Rise Time (nsec) |
| --- | --- | --- | --- | --- |
| Present Invention | $10^{-12}$ | 1 | 100 | 1 |
| Marx-type Pulse Systems | $3 \times 10^{-9}$ | Non-Repetitive | 100 | 12 |
| Gray U.S. Pat. No. 3,644,747 | Capability not disclosed in specification | Unspecified | Unspecified | ~5 |
| Doss et al. U.S. Pat. No. 3,603,887 | Capability not disclosed in specification | 120 | 80 | ~65 $\times 10^3$ |
| Kulikov et al. U.S. Pat. No. 3,558,908 | Capability not disclosed in specification | $10^6$ | 250 | 50 |

It is one object of the invention, therefore, to provide an improved isolated trigger pulse generator apparatus which effectively eliminates ground loops from the high voltage pulse generation sub-system to other elements of the system.

It is another object of the invention to provide an improved isolated trigger pulse generator apparatus of small size in which large voltage hold-off capability and close coupling is provided by means of a new transformer design.

It is yet another object of the invention to provide an improved isolated trigger pulse generator apparatus the pulse generator switch 14 in the closed position a 10 kV potential is established across the primary coil 15 of transformer 16. By means of transformer 16 the 10 kV potential in its primary coil 15 is stepped up to a value of 100 kV in its secondary coil 17. The secondary coil 17 charges capacitor bank 18 through coaxial cable 31. The secondary coil 17 resonates with capacitor bank 18 and, therefore, charges the capacitor bank 18 to 100 kilo-volts within 1 micro-second of establishment of the potential difference across the primary 15. Capacitor 18 discharge is accomplished via the liquid dielectric switch 19 in sub-nanosecond time which results in applying a voltage to the primary coil 20 of the output transformer 21. With the primary capacitor 12 of the same energy content as the secondary capacitor 18 to be charged, the transfer efficiency approaches 100%.

Because the subject invention is designed to operate at very high frequencies, it is critical that stray capacitances, leakage inductances and core losses in the output transformer be minimized. Flux leakages are minimized by: (1) the solid conductive metal composition of primary winding 20, (2) the unique composition of transformer core 27, and (3) transformer geometry. The primary winding 20 of output transformer 21 is a toroidal-shaped, single-turn, solid metal conductor which completely fills the space inside the multiple secondaries 22. Close coupling is achieved by thus minimizing flux leakage while transformer capacitance is reduced by the single turn geometry. The single turn configuration of the primary also permits extremely rapid increases in magnetizing inductance while the gentle curvature of its outer surface eliminates high voltage gradients which occur at surface irregularities. Large inductance is also achieved by means of a core material having a high magnetic permeability. The transformer core 27 is located entirely within the output transformer's primary 20. The core consists of an amorphous material having the chemical formula $Fe_{80}B_{20}$ which is approximately 95% iron by weight thus permitting very large flux swing. Its unique magnetic properties permit magnetic flux absorption in nanosecond time with a magnetic field less than 1% that of free space. Lamination voltage breakdown, a major space of failure in submicro-second transformer cores, is kept to a minimum by virtue of the high magnetic permeability of this core material. Again, flux leakage is minimized because the transformer core is located within the transformer's primary coil. A multiplicity of single-turn secondaries 22 of the output transformer 21 are equally spaced around the primary 10. Extremely rapid output transformer rise times are possible because of the single-turn primary and secondary configuration which minimizes capacitive coupling effects. The secondary coils 22 are each joined to a twin lead transmission line 23 by means of a strapped down clamp 24. Each twin lead 23 is in turn connected to the respective electrodes of a dense plasma focus device by means of a three electrode spark gap in the preferred embodiment. This configuration minimizes stray fields between the output transformer's primary and secondary leads and permits a single high voltage pulse to be distributed to a multiplicity of remote spark gaps with simultaneity of discharge. This simultaneity of high voltage charge distribution is not available in prior art devices which have been able to reduce time delay jitter to approximately a nanosecond.

The liquid dielectric switch 19 is located adjacent to the base of the rectangular container 26 housing the trigger pulse generator. When triggered, it permits the discharge of capacitor bank 18 into the output transformer's primary 20. The spark gap 19 is immersed in a liquid dielectric 25 which covers the container's base and provides high voltage hold-off capability. While either an oil or water dielectric could be used to provide the necessary voltage holding, the preferred dielectric is a completely fluorinated hydrocarbon. The specific fluorinated hydrocarbon utilized in this trigger pulse system is Fluorinert which is a tradename of the Minnesota Mining and Manufacturing Company. This chemical, the exact composition of which is a trade secret, is electrically inert and has an atomic weight of approximately 500. Fluorinert proved to be very effective in this application because of its voltage holding capability, ease of handling and low dielectric constant in the vapor phase. It proved to be an efficient heat transfer medium for gap, core, windings, capacitors and cable terminations, particularly when undergoing a phase change from liquid to vapor. In the liquid state Fluorinert is capable of sustaining 200 kV/mm for several microseconds which makes it comparable to high quality solid insulators in strength. In the vapor phase it provides a 20 kV/mm dielectric strength thus protecting transformer components located in the upper portion of container 26 while lowering the isolation capacitances therein. In addition, the liquid is "self-healing" and, therefore, does not require repair or replacement as in the case of a solid dielectric. This allows the trigger pulse generator to be operated repeatedly.

Thus, it is apparent that there has been provided, in accordance with the invention, an isolated trigger pulse generator apparatus that fully satisfies the objects, aims, and advantages set forth above. While the invention has been described in conjunction with specific embodiments thereof, it is evident that many alternatives, modifications and variations will be apparent to those skilled, it is intended to embrace all such alternatives, modifications, and variations as fall within the spirit and broad scope of the appended claims. In particular, it is to be noted that while the present invention is intended to generate high energy impulses, its performance would not be degraded if operated at lower voltages and currents. In addition, it should be apparent that while the subject invention has been discussed primarily in terms of its application in a dense plasma focus device, the isolated trigger pulse generator apparatus has application in any system requiring repeated high voltage, short duration electrical discharges.

What is claimed is:

1. A trigger pulse generator for producing a multiplicity of isolated impulses with pico-second simultaneity comprising in combination:
   an electrical pulse generator for providing input pulses;
   capacitor means coupled to said pulse generator to receive a charging current thereform;
   a transformer having a circular primary coil, a core and a multiplicity of secondary coils, the primary coil being electrically connected to said capacitor means by means of a dielectric spark gap; and
   an enclosure means containing a liquid dielectric in which the capacitor means, the transformer and the spark gap are located, said spark gap being immersed in the liquid dielectric within said enclosure means.

2. A trigger pulse generator as described in claim 1, wherein the core of said transformer is an amorphous material having the chemical formula $Fe_{80}B_{20}$.

3. A trigger pulse generator as described in claim 1, wherein the primary and secondaries of said transformer make a single turn around said transformer core.

4. A trigger pulse generator for producing a multiplicity of isolated impulses with pico-second simultaneity comprising in combination:
   an electrical generator for providing input pulses;
   capacitor means coupled to said pulse generator to receive a charging current thereform;
   a transformer, said transformer having a toroidal shaped primary, a toroidal shaped core located within the primary, and a multiplicity of single-turn secondaries spaced around said primary coil;

circuit means including a liquid dielectric spark gap for electrically connecting the capacitor means to the primary of said transformer;

housing means for enclosing the capacitor means, the transformer and the spark gap; and a liquid dielectric contained in said housing means and in which said spark gap is immersed such that voltage breakdown of said spark gap causes electrical impulses to be established in the secondaries of said transformer.

* * * * *